United States Patent [19]
Emori et al.

[11] Patent Number: 5,270,586
[45] Date of Patent: Dec. 14, 1993

[54] CONTROLLABLE DELAY LOGIC CIRCUIT FOR PROVIDING VARIABLE DELAY TIME

[75] Inventors: Shinji Emori, Urawa; Masaya Tamamura, Inagi, both of Japan

[73] Assignee: Fujitsu Limited, Kawasaki, Japan

[21] Appl. No.: 766,531

[22] Filed: Oct. 31, 1990

[51] Int. Cl.$^5$ ............... H03K 19/20; H03K 5/13
[52] U.S. Cl. ................... 307/455; 307/597; 307/603
[58] Field of Search ............ 307/455, 592, 597, 603, 307/608

[56] References Cited

U.S. PATENT DOCUMENTS

| | | | |
|---|---|---|---|
| 4,641,048 | 2/1987 | Pollock | 307/591 |
| 4,713,560 | 12/1987 | Herndon | 307/455 |
| 4,893,036 | 1/1990 | Hester | 307/608 |
| 4,999,519 | 3/1991 | Kitsukawa et al. | 307/446 |
| 5,066,877 | 11/1991 | Hamano et al. | 307/608 |

FOREIGN PATENT DOCUMENTS

| | | |
|---|---|---|
| 0249541 | 12/1987 | European Pat. Off. |
| 0249665 | 12/1987 | European Pat. Off. |
| 61-20427 | 1/1986 | Japan |

OTHER PUBLICATIONS

"Time Delay Circuit for Pulse Signal", IBM Technical Disclosure Bulletin, vol. 30, No. 3, Aug., 1987.

*Primary Examiner*—Edward P. Westin
*Assistant Examiner*—Andrew Sanders
*Attorney, Agent, or Firm*—Armstrong, Westerman, Hattori, McLeland & Naughton

[57] ABSTRACT

A controllable delay logic circuit includes a differential circuit having first and second transistors, a first load coupled between a first power supply line and the collector of the first transistor, a second load coupled between the first power supply line and the collector of the second transistor, and a constant-current source connected between a second power supply line and the emitters of the first and second transistors. The controllable delay logic circuit also includes a first power source, a first current path circuit having a first resistor and selectively allowing a first current to pass through the first transistor from the first power source via the first resistor, and a second current path circuit having a second resistor and selectively allowing a second current to pass through the second transistor from the first power source via the second resistor.

15 Claims, 13 Drawing Sheets

CONTROLLABLE DELAY LOGIC CIRCUIT FOR PROVIDING VARIABLE DELAY TIME

BACKGROUND OF THE INVENTION

1. Field of the Invention

The present invention generates relates to a controllable delay logic circuit, and more particularly to an improvement in an arrangement of an emitter coupled logic circuit.

2. Description of the Related Art

There is known an emitter coupled logic circuit (hereinafter simply referred to as an ECL circuit) which is a high-speed digital logic circuit using a pair of transistors forming a current switch circuit. ECL circuits are widely used, as logic gates, in various large scale integrated circuits. An ECL circuit has an inherent propagation delay time. In some applications, the inherent propagation delay time of the ECL circuit is positively utilized. For example, a signal delay circuit is formed of the ECL circuit. A variable coaxial tube is known as an element capable of providing a precise signal propagation delay time.

Normally, the propagation delay time depends on various factors, such as the type of ECL circuit and device structure thereof, and are inherently determined at the time of completion of the production process. Thus, it is substantially impossible to adjust the propagation delay time after the production process. Nevertheless, there is a need to positively control the propagation delay time from the outside of the ECL circuit.

Referring to FIG. 1, there is illustrated a general ECL circuit. The ECL circuit in FIG. 1 has a pair of transistors T1 and T2 having emitters mutually connected. A constant-current source transistor T3 is connected between a power supply line coupled to a first low-potential side power source $V_{EE1}$ and a node at which the emitters of the transistors T1 and T2 are mutually connected. Pull-up resistors $R_L$ are respectively connected between the collectors of the transistors T1 and T2 and a power supply line having a ground potential GND. A node at which the collector of the transistor T1 is connected to the pull-up resistor $R_L$ forms an output terminal $\bar{x}$, which is connected to a base of an output transistor T4 which forms an output circuit of an emitter follower on the side of the transistor T1. Similarly, a node at which the collector of the transistor T2 is connected to the pull-up resistor $R_L$ forms an output terminal x, which is connected to a base of an output transistor T5 which forms an output circuit of an emitter follower on the side of the transistor T2.

An emitter follower circuit is composed of the transistors T4 and T5, resistors $R_{T1}$ and $R_{T2}$ respectively connected to the emitters of the transistors T4 and T5, and a second negative-side power source $V_{EE2}$. It will be noted that the emitter follower circuit is not needed for the basic operation of the ECL circuit. However, the emitter follower circuit is usually provided in order to obtain a matching between the potential of an input signal and the potential of an output signal and increase load drivability of the ECL circuit. Due to the function of the emitter follower circuit, the voltages of the output terminals x and $\bar{x}$ are shifted, in parallel form, to signal output terminals X and $\bar{X}$ of the emitter follower circuit, respectively. The base of the constant-current source transistor T3 is supplied with a reference voltage $V_{cs}$, which is a fixed potential. Signal input terminals IN, and $\overline{IN}$ are provided at the bases of the transistors T1 and T2, respectively.

When an input signal (H) having a potential higher than a potential of the signal input terminal $\overline{IN}$ is applied to the signal input terminal IN, the transistor T1 is turned ON. Thus, a constant current $I_{cs}$ passes through the transistor T3. The constant current $I_{cs}$ causes a voltage drop developed across the pull-up resistor $R_L$. The voltage drop decreases the potential of a node (output terminal $\bar{x}$) at which the collector of the transistor T1 and the pull-up resistor $R_L$ are connected to each other, so that the potential of the node becomes equal to a low (L) level. This low level is applied to the base of the output transistor T4. Thus, an inverted version of the input signal appears at the emitter of the output transistor T4, that is, the signal output terminal $\bar{X}$ of the emitter follower circuit. On the other hand, during the above-mentioned operation, the transistor T2 is turned OFF, and there is no voltage drop developed across the pull-up resistor $R_L$ connected to the collector of the transistor T2. Thus, the base potential of the transistor T5 is approximately equal to the ground potential GND. As a result, a signal (H) in phase with the input signal appears at the output terminal x and the emitter of the transistor T5, that is, the signal output terminal X. In the case where the potential of the input signal applied to the signal input terminal IN is lower than the potential of the input terminal $\overline{IN}$, the circuit operates in a way opposite to the above-mentioned operation. Thus, a high-potential output signal is obtained at the signal output terminals $\bar{x}$ and $\bar{X}$, and a low-potential output signal is obtained at the output terminals x and X.

A propagation delay time $t_{pd}$ of the ECL circuit shown in FIG. 1 is expressed as follows.

$$t_{pd}=A \cdot rb \cdot C_{cb}+B \cdot rb \cdot C_{be}+C \cdot C_{bc}(R_L+re)+D \cdot C_{be}re + E \cdot C_{sub}(R_L+re)+F \cdot C_L \cdot (R_L+re)+t_{pd}EF \quad (1)$$

where A through E are proportion coefficients, and $t_{pd}EF$ is a propagation delay time provided by the emitter follower circuit. Further, the following symbols denotes parameters of the transistors T1 and T2:

$C_{cb}$: base-collector junction capacitance
$C_{be}$: base-emitter junction capacitance
$C_{sub}$: collector-substrate junction capacitance
$C_L$: parasitic capacitance between pull-up resistor $R_L$ and wiring lines
rb: base resistance
re: sum of an emitter resistance and differentiating resistance of the base-emitter forward characteristic.

That is, the propagation delay time $t_{pd}$ of the ECL is as follows $$t_{pd} = \sum_{x=1}^{n} R_x C_x + t_{pd}EF \quad (2)$$

The term $t_{pd}$ is not related to the present invention, an is thus handled so that it is zero. The formula (2) means that the propagation delay time $t_{pd}$ corresponds to the sum of the products of the resistances and the corresponding capacitances, and is thus based on the time constant defined by a formula, $\tau = R \cdot C$.

FIG. 2 is a waveform diagram illustrating how the propagation delay time $t_{pd}$ of the ECL circuit shown in FIG. 1 is generated. In FIG. 2, $V_{IN}$ denotes an input voltage applied to the signal input terminal IN shown in FIG. 1, and $V_{\overline{IN}}$ denotes an input voltage applied to the input terminal $\overline{IN}$ shown in FIG. 1. Further, $V_X$ denotes an output voltage obtained at the signal output terminal X, and $V_{\overline{X}}$ denotes an output voltage obtained at the signal output terminal $\overline{X}$. The propagation delay time $t_{pd}$ corresponds to a period between a time when the input voltage difference between $V_{IN}$ and $V_{\overline{IN}}$ corresponds to 50% (that is, 0 volt) of the maximum difference and a time when the output voltages $V_X$ and $V_{\overline{X}}$ correspond to 50% of the maximum amplitudes. As shown in FIG. 2, the rise and fall of the output voltages $V_X$ and $V_{\overline{X}}$ lag behind those of the input voltages $V_{IN}$ and $V_{\overline{IN}}$ by the propagation delay time $t_{pd}$. The slope of the rise (or fall) of the output voltage obtained at each of the signal output terminals X and $\overline{X}$ is based on the time constant of the pull-up resistor $R_L$ and the parasitic capacitance $C_L$ as well as the constant current $I_{cs}$.

In order to adjust the propagation delay time $t_{pd}$ from the outside of the ECL circuit, one may try to change a reference voltage $V_{cs}$ applied to the base of the constant-current transistor T3 so that the constant current $I_{cs}$ is changed and thus the amplitude of the output voltage is changed.

However, the above consideration is not effective to control the propagation delay time $t_{pd}$ from the outside of the ECL circuit for the following reasons. First, the aforementioned formula (1) does include the term of the constant current $I_{cs}$. That is, the constant current $I_{cs}$ does not contribute to changing the propagation delay time $t_{pd}$. Although the amplitude of the output voltage $V_X$ ($V_{\overline{X}}$) is changed by changing the constant current $I_{cs}$, the rising slope and falling slope of the output voltage are also changed. As a result, there is less change in the propagation delay time $t_{pd}$, and the circuit operation is instable. More specifically, when the reference voltage $V_{cs}$ is controlled so that the current passing through the transistor T3 increases, an increased voltage drop developed across the pull-up resistor $R_L$ is obtained and thus an increased amplitude of the output signal is obtained. However, an increase in the current increases the load drivability, which accelerates the circuit operation. Thus, it is possible to control the propagation delay time within only a narrow range.

SUMMARY OF THE INVENTION

It is a general object of the present invention to provide an improved controllable delay logic circuit in which the above-mentioned disadvantages are eliminated.

A more specific object of the present invention is to provide a controllable delay logic circuit having a propagation delay time which can be very reliably controlled from the outside of the delay logic circuit in the stable state.

The above-mentioned objects of the present invention are achieved by a controllable delay logic circuit comprising: a differential circuit having first and second transistors respectively having a collector, an emitter and a base, the emitters of the first and second transistors being connected to each other, the bases of the first and second transistors being respectively supplied with first and second input signals, and first and output signals being drawn from the collectors of the first and second transistors, respectively; a first load coupled between a first power supply line and the collector of the first transistor; a second load coupled between the first power supply line and the collector of the second transistor; and a constant-current source connected between a second power supply line and the emitters of the first and second transistors. The controllable delay logic circuit also comprises: a first power source; first current path means, having a first resistor, for selectively allowing a first current to pass through the first transistor from the first power source via the first resistor; and second current path means, having a second resistor, for selectively allowing a second current to pass through the second transistor from the first power source via the second resistor.

The above-mentioned objects of the present invention are also achieved by respectively replacing the first current path means and the second current path means by first time constant control means, having a first resistor, for varying a first time constant defined by the first resistor and a parasitic capacitance coupled to the collector of the first transistor, and second current path means, having a second resistor, for varying a second time constant defined by the second resistor and a parasitic capacitance coupled to the collector of the second transistor.

The aforementioned objects of the present invention are also achieved by respectively replacing the above-mentioned first time constant control means and second time constant control means by first load resistance control means, coupled to the first load, for varying a first load resistance provided by the first load, and second load resistance control means, coupled to the second load, for varying a second load resistance provided by the second load.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
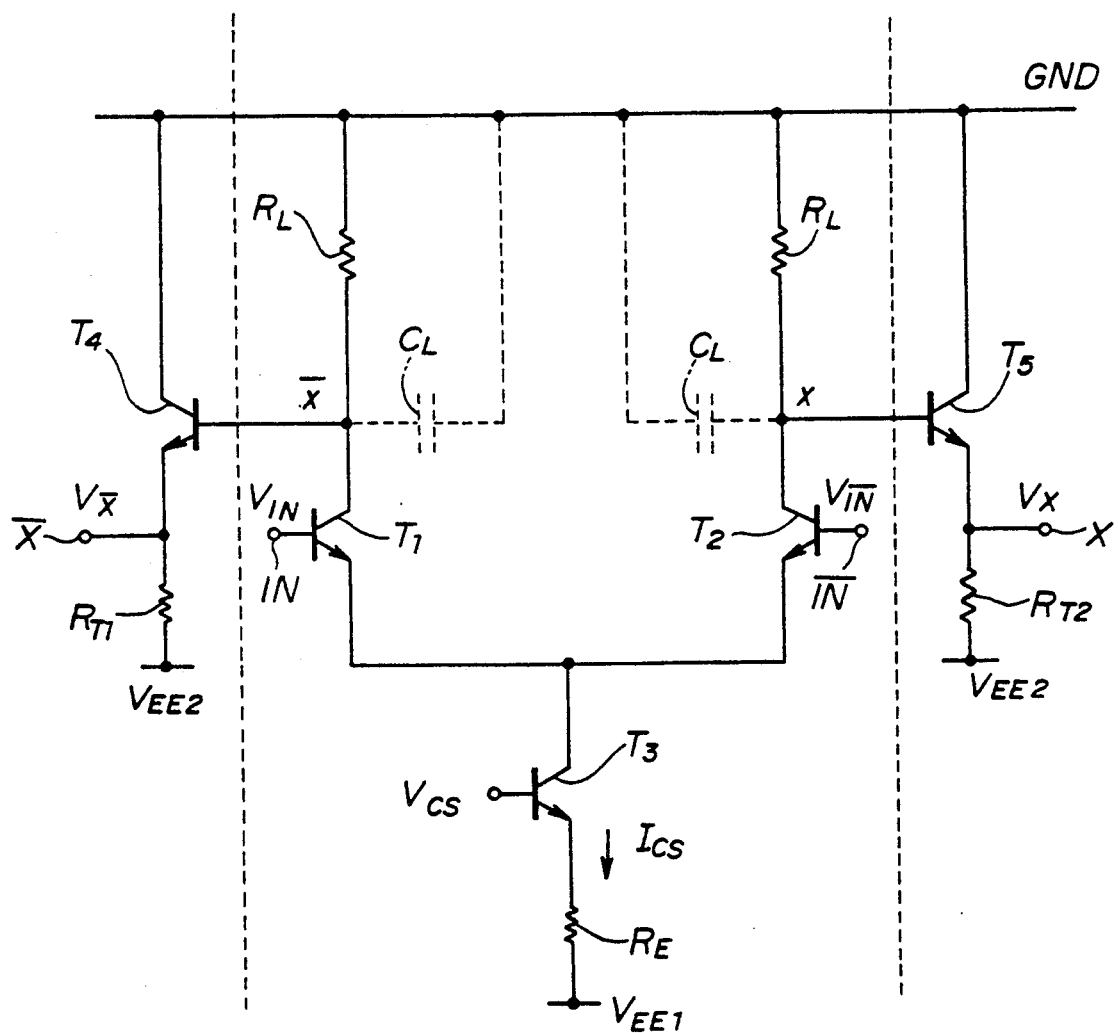
FIG. 1 is a circuit diagram of a conventional ECL circuit.
Figure 2:
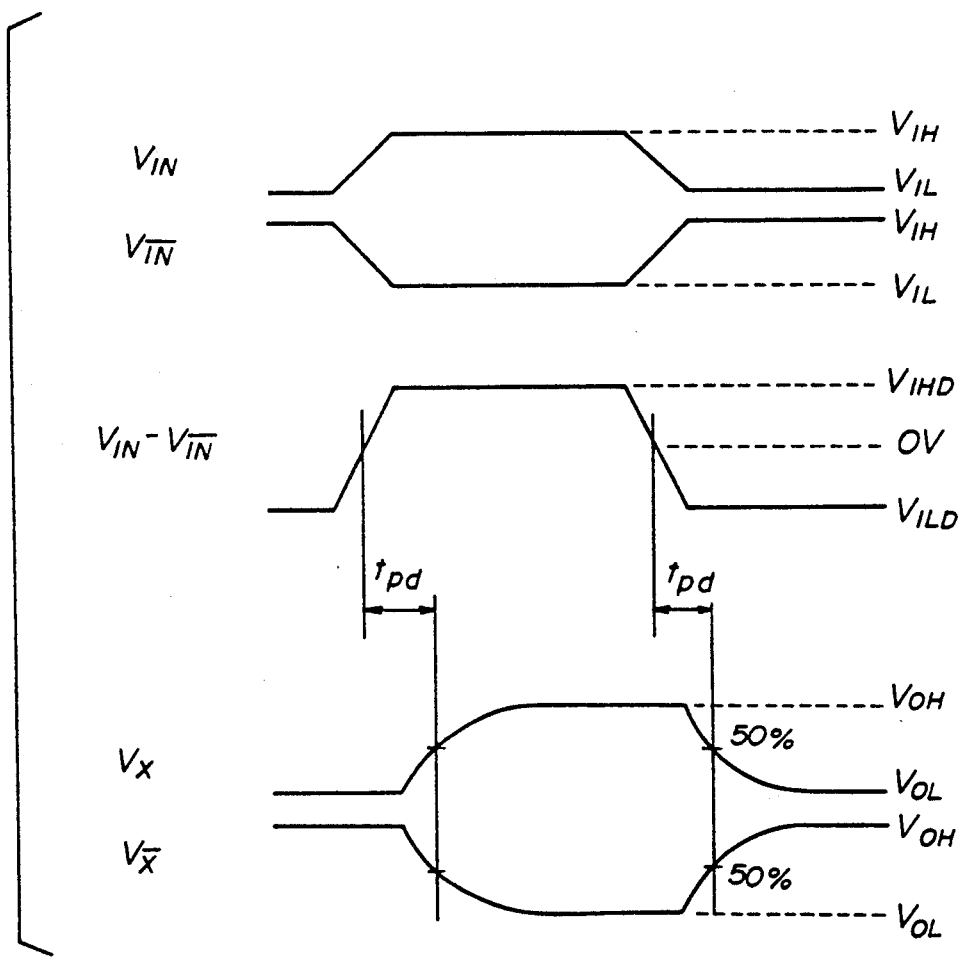
FIG. 2 is a waveform diagram illustrating the operation of the ECL circuit shown in FIG. 1.

A description will now be given of the outline of the present invention with reference to FIG. 3, in which those parts which are the same as those shown in FIG. 1 are given the same reference numerals or symbols. The present invention has a means for controlling the pull-up resistors $R_L$ shown in FIG. 1.

Figure 3:
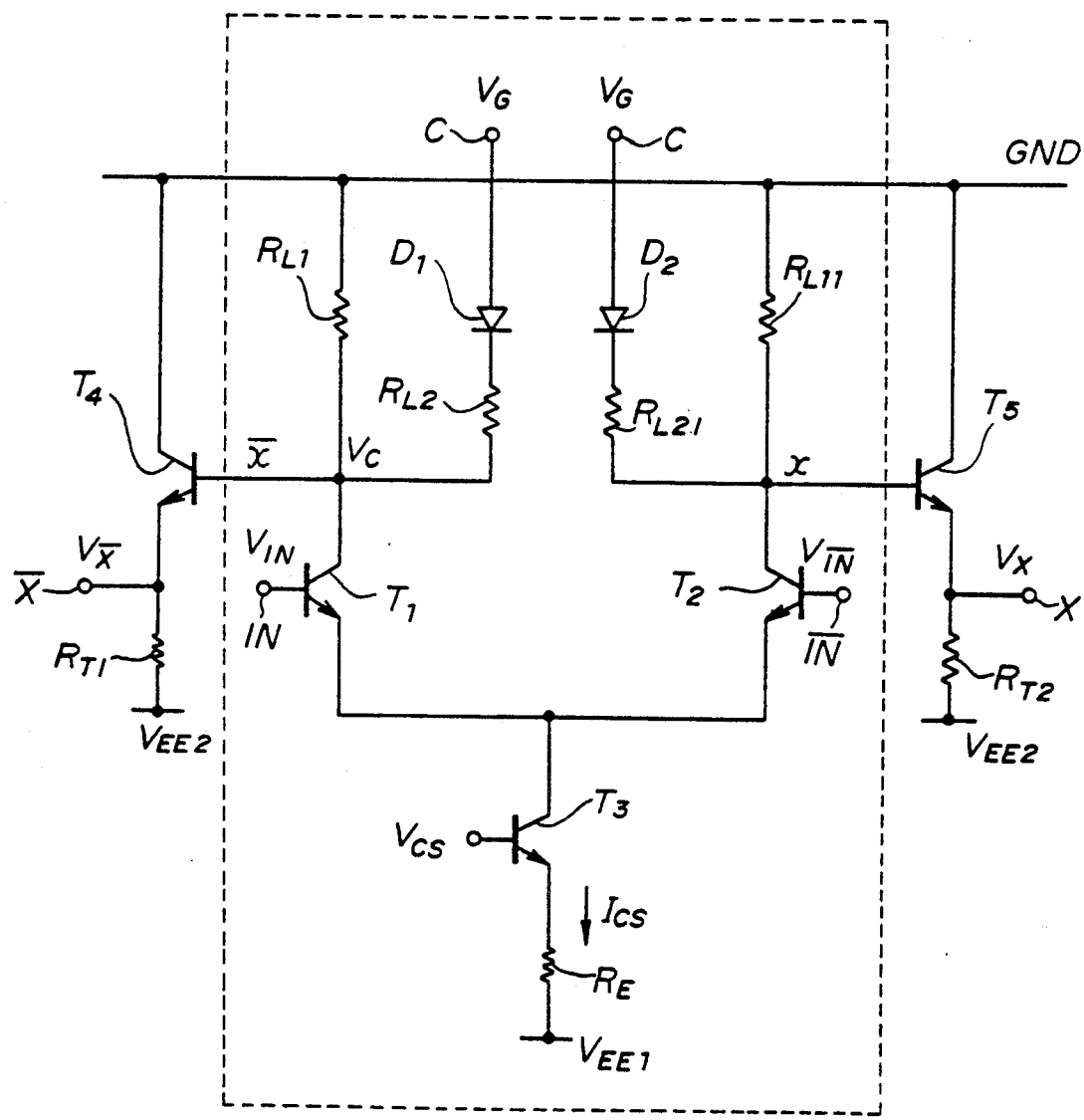
FIG. 3 is a circuit diagram illustrating the outline of an ECL circuit according to the present invention.

Referring to FIG. 3, an ECL circuit has a current switch circuit composed of an emitter-coupled transistors T1 and T2, two load circuits formed of resistors $R_{L1}$ and $R_{L11}$, and a current source formed of the current-source transistor T3 which supplies the emitters of the transistors T1 and T2 with the current $I_{cs}$, in the same way as the ECL circuit shown in FIG. 1.

A series circuit (current path) composed of a diode D1 and a resistor $R_{L2}$ connected in series is substantially connected between the load resistor $R_{L1}$. The cathode of the diode D1 is connected to the resistor $R_{L2}$. Similarly, a series circuit (current path) composed of a diode D2 and a resistor $R_{L21}$ connected in series is substantially connected between the load resistor $R_{L11}$. The cathode of the diode D2 is connected to the resistor $R_{L21}$. The anodes of the diodes D1 and D2 are connected to control terminals C, to which a control voltage $V_G$ is applied. The control terminals C are coupled to the ground-potential power supply line in view of AC circuit. By changing the control voltage $V_G$, it is possible to continuously vary the propagation delay time $t_{pd}$. The diodes D1 and D2 may be respectively formed of diode-connected transistors. It is preferable to use the transistors T4 and T5 in the same way as transistors T4 and T5 shown in FIG. 1 in order to obtain a matching between the potential of the input signal and the potential of the output signal and increase load drivability of the ECL circuit. However, it should be noted that the transistors T4 and T5 are not essential to realize the ECL circuit operation. It should also be noted that the circuit shown in FIG. 3 functions as a single-end drive type ECL circuit is formed by applying a reference voltage to the signal input terminal $\overline{IN}$, and functions as a differential input type ECL circuit by respectively applying input signals having mutually opposite phases to the signal input terminals IN and $\overline{IN}$.

When the control terminals C are maintained at a positive potential enough to turn ON the diode D1 (or D2), the pull-up resistance $R_L$ of the ECL circuit is equivalent to a resistance $R_{LD}$ provided by a parallel circuit composed of the load (pull-up) resistor $R_{L1}$ and the resistor $R_{L2}$. The equivalent pull-up resistance is expressed as follows:

$$R_L = R_{LD} R_{L1} // R_{L2} = (R_{L1} \times R_{L2})/(R_{L1} + R_{L2}) \tag{3}$$

where symbol // represents a parallel connection.

On the other hand, when the control terminals C are maintained at a negative potential enough to turn OFF the diode D1 (or D2), the pull-up resistance $R_L$ of the ECL circuit is as follows:

$$R_L = R_{LS}, R_{L1} > (R_{L1} // R_{L2}) = R_{LD} \tag{4}$$

where $R_{LS}$ represents an equivalent pull-up resistance in the state where the resistor $R_{L2}$ is disconnected from the circuit because of the OFF state of the diode D1 (or D2). From the formula (4), the following is obtained.

$$R_{LS} > R_{LD}$$

From the formula (1), the following is obtained $$t_{pds} > t_{pdD} \tag{5}$$

where $t_{pds}$ is a propagation delay time obtained when $R_L = R_{LS}$, and $t_{pdD}$ is a propagation delay time obtained when $R_L = R_{LD}$.

Figure 4:
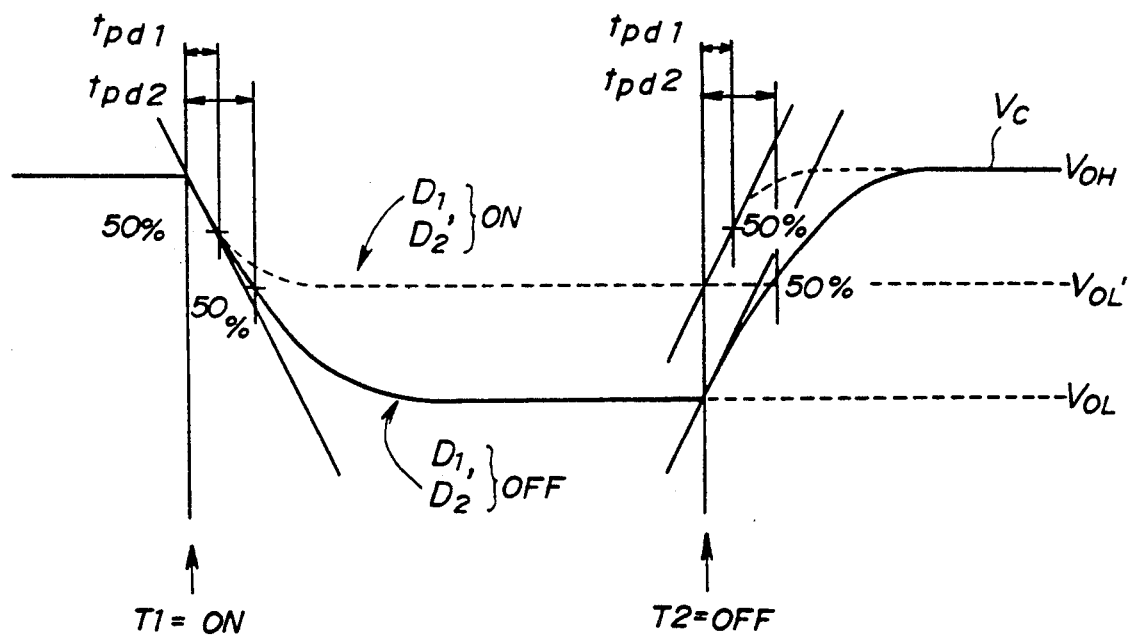
FIG. 4 is a waveform diagram illustrating the operation of the circuit shown in FIG. 3.

FIG. 4 is a waveform diagram illustrating a waveform of a collector voltage Vc of the transistor T1 observed when the transistors T1 and T2 are turned ON and OFF, respectively. The waveform of the collector voltage Vc is based, in principle, on a discharge characteristic defined by a resistance and a capacitance (collector time constant). The slope of the rise or fall of the collector voltage Vc obtained immediately after the transistor T1 (T2) is switched (turned ON or OFF) does not depend on the control signal voltage $V_G$ of the control terminal C (that is, does not depend on the ON/OFF state of the diode D1), but is constant. The amplitude of the collector voltage Vc is small when the diodes D1 and D2 are ON, and large when the diodes D1 and D2 are OFF. Thus, it is possible to vary the time it takes to obtain half the maximum amplitude of the collector voltage Vc, that is, to vary the propagation delay time $t_{pd}$. The collector voltages Vc of the transistors T1 and T2 are changing momentarily and, in actuality, the bias voltage applied to the diodes D1 and D2 are changing momentarily. Hence, in actuality, the waveforms of the collector voltages Vc will be more complex than those shown in FIG. 4. By setting a bias voltage $V_{BS}$ of each of the diodes D1 and D2 to an intermediate voltage which satisfies the formulas (3) and (4) by adjusting the control voltage $V_G$, the control voltages Vc of the transistors T1 and T2 change in accordance with an intermediate curve between the solid line and the broken line shown in FIG. 4. As a result, it becomes possible to continuously select an arbitrary propagation delay time between a propagation delay time $t_{pd1}$ obtained when the diodes D1 and D2 are ON and a propagation delay time $t_{pd2}$ obtained when the diodes D1 and D2 are OFF. This means that the propagation delay time $t_{pd}$ of the ECL circuit can be controlled outside of the ECL circuit.

Figure 5:
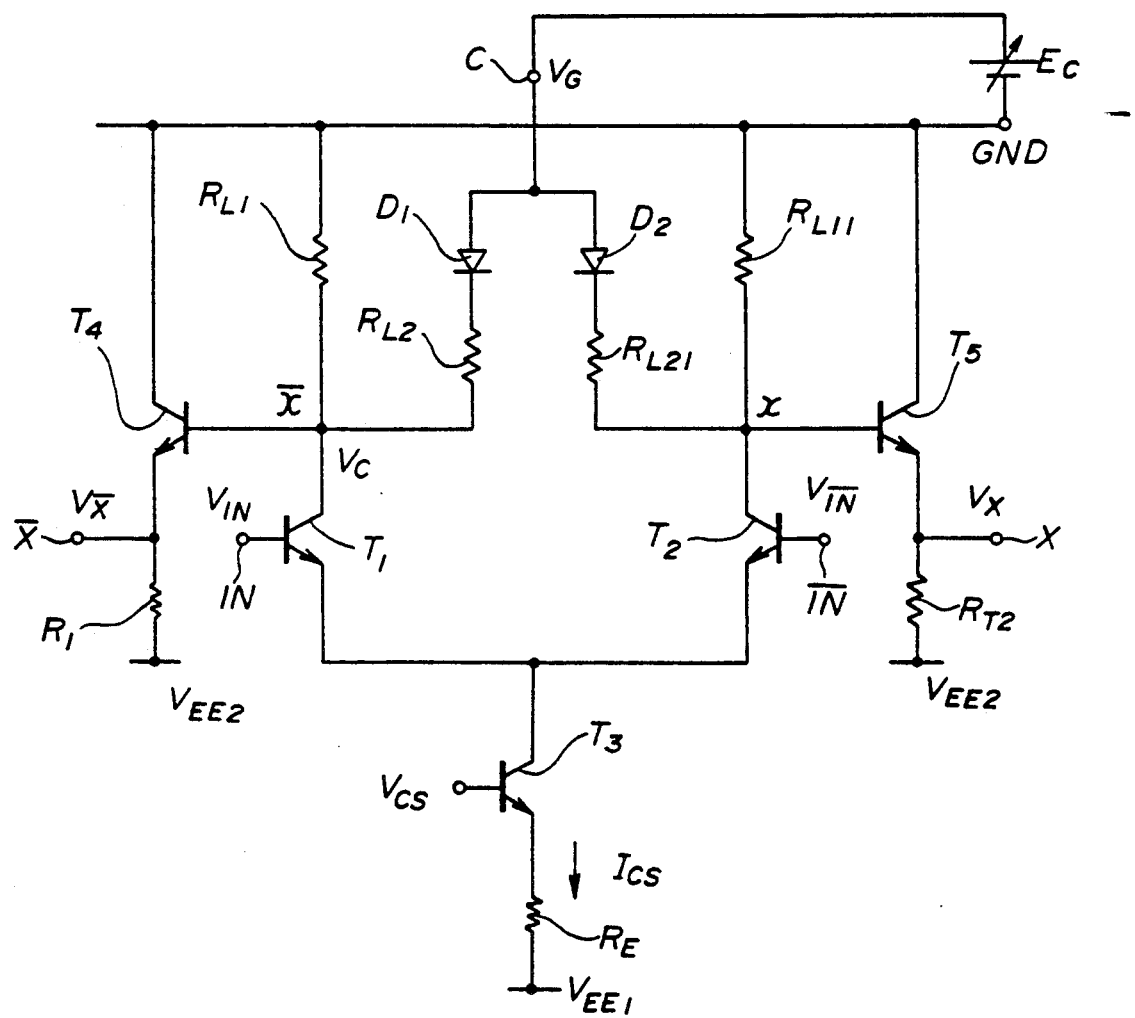
FIG. 5 is a circuit diagram of an ECL circuit according to a first preferred embodiment of the present invention.

A description will now be given of an ECL circuit according to a first embodiment of the present invention with reference to FIGS. 5 and 6, in which those parts which are the same as those shown in FIG. 3 are given the same reference numerals. As shown in FIG. 5, the anodes of the diodes D1 and D2 are connected to the control terminal C provided in common. A variable control voltage source Ec is connected between the power supply line having the ground potential GND and the control terminal C. More specifically, the positive terminal of the variable control voltage source Ec is connected to the control terminal C, and the negative terminal thereof is connected to the ground-potential power supply line. The variable control voltage source Ec can be formed of an internal circuit of a device which generates the voltage Ec externally controllable. Alternatively, it is possible to form the variable control signal source Ec of an external source outside of the device.

It is now assumed that the level of the input signal $V_{IN}$ applied to the signal input terminal IN becomes higher than that of the input signal $V_{\overline{IN}}$ applied to the signal input terminal $\overline{IN}$. In this case, the transistor T1 is turned ON, and the transistor T2 is turned OFF. A current passes from the ground potential GND to the first low-potential side voltage $V_{EE1}$ through the pull-up resistor (load resistor $R_{L1}$, the transistor T1 and the constant-current source transistor T3. During this time, if the diode D1 is forward biased by the variable control voltage source Ec, a current passes from the ground potential GND to the first low-potential side voltage $V_{EE1}$ through the variable control voltage source Ec, the diode D1, the resistor $R_{L2}$, the transistor T1 and the constant-current source transistor T3. That is, there are provided two current paths. The current $I_{cs}$ passing through the constant-current source transistor T3 is constant and formed by the currents respectively passing through the above-mentioned two current paths. In this case, from the point of view of equivalent circuit, it can be considered that the resistor $R_{L2}$ is connected in parallel to the pull-up resistor $R_{L1}$. Thus, the load resistance of the transistor T1 has a decreased value, as compared with the case where only the pull-up resistor (load resistor) $R_{L1}$ is connected to the transistor T1. As a result, by setting the control voltage $V_G$ generated by the variable control voltage source Ec so that the aforementioned condition is satisfied, it is possible to reduce the amplitudes of the output voltages $V_X$ and $V_{\overline{X}}$, as shown by the broken lines shown in FIG. 6-(a). In FIG. 6 denotes the "high (H)" level obtained on the input side of the ECL circuit, and $V_{IL}$ denotes the "low (L)" level obtained on the input side thereof. Further, in FIG. 6, $V_{OH}$ denotes the "high (H)" level obtained on the output side of the ECL circuit, and $V_{OL}$ and $V_{OL}$, respectively denote "low (L)" levels obtained on the output side thereof.

Figure 6:
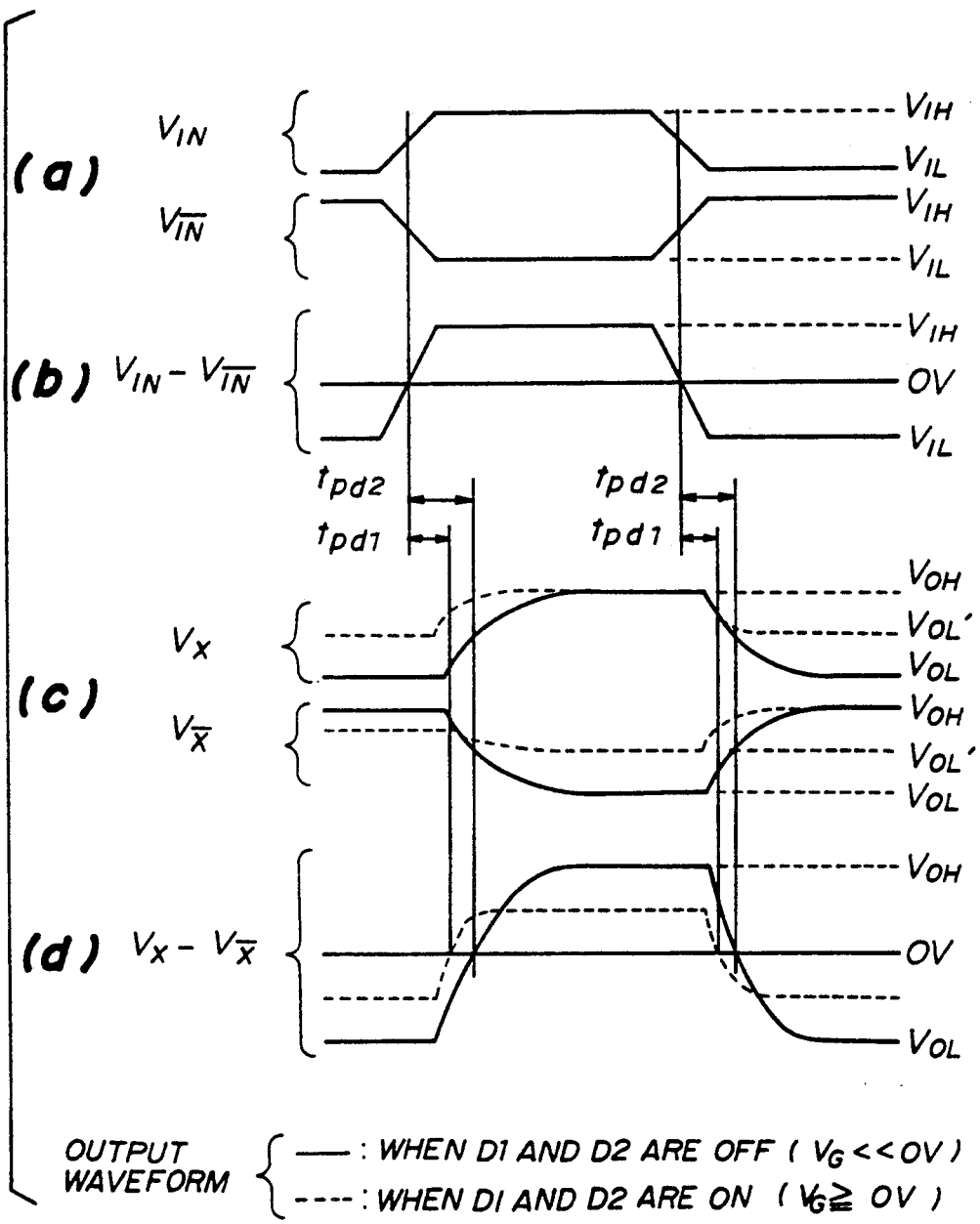
FIG. 6 is a waveform diagram illustrating the operation of the ECL circuit shown in FIG. 5.

As shown in FIG. 6-(b) and (c), the propagation delay time $t_{pd1}$ obtained when the output voltages $V_X$ and $V_{\overline{X}}$ have the reduced amplitudes in the state where the diodes D1 and D2 are ON is shorter than the propagation delay time $t_{pd2}$ obtained when the diodes D1 and D2 are OFF. This fact represents that the propagation delay time $t_{pd}$ of the ECL circuit is controlled by turning ON/OFF the diodes D1 and D2. FIG. 6-(d) shows the differences between $V_X$ and $V_{\overline{X}}$ obtained when the diodes D1 and D2 are ON and OFF, respectively. By turning ON the diode D1 and thereby connecting the resistor $R_{L2}$ to the pull-up resistor $R_{L1}$ in parallel form in the state where the transistor T1 is ON, it becomes possible to change the propagation delay time $t_{pd}$ of the ECL circuit. In based on the control voltage $V_G$, it becomes possible to change the collector voltage Vc and thus continuously change the propagation delay time $t_{pd}$. The above description is related to the case where the input signal $V_{IN}$ rises. Similarly, the ECL circuit shown in FIG. 5 operates when the input signal $V_{IN}$ falls.

Figure 7:
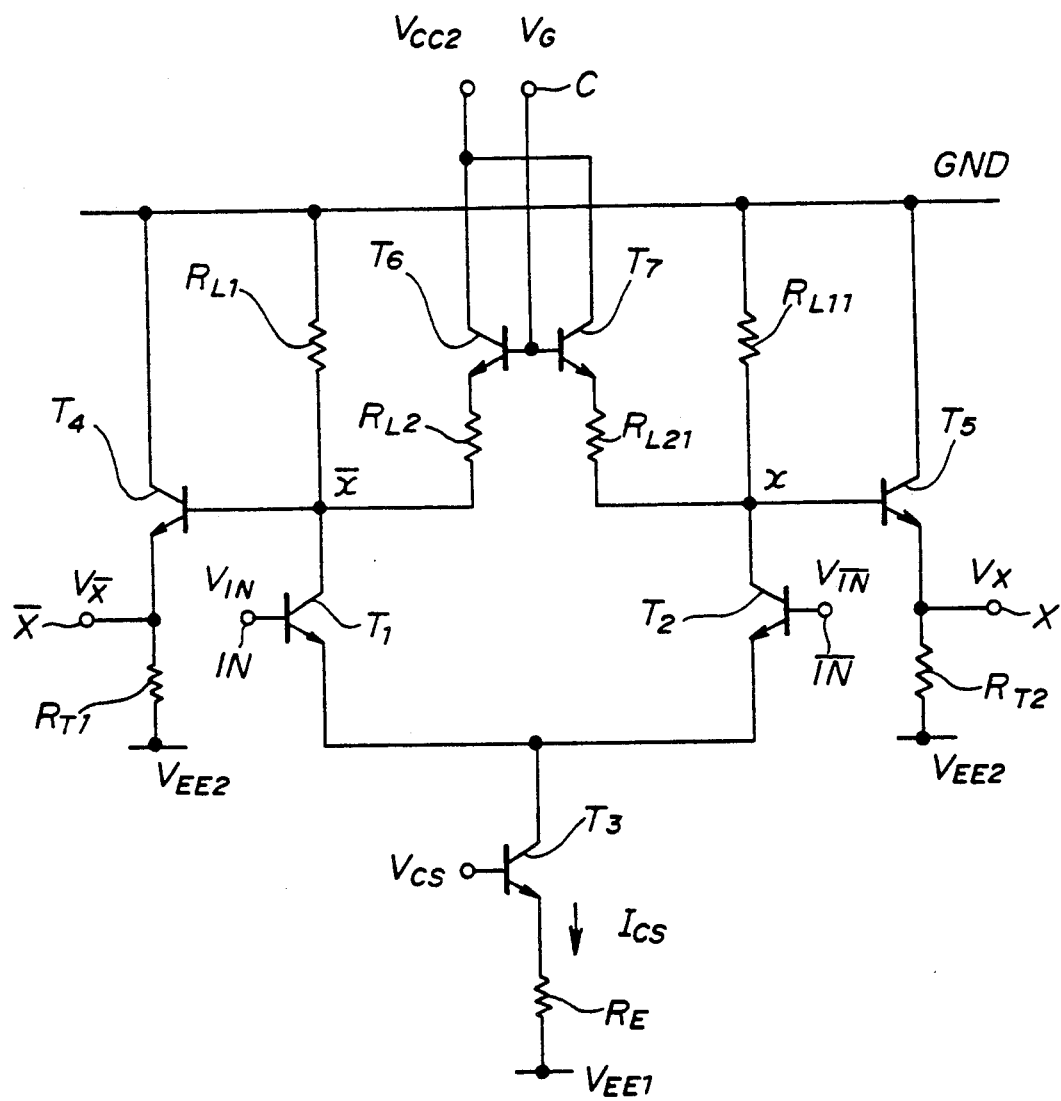
FIG. 7 is a circuit diagram of an ECL circuit according to a second preferred embodiment of the present invention.

A description will now be given of an ECL circuit according to a second preferred embodiment of the present invention with reference to FIG. 7, in which those parts which the same as those shown in the previous figures are given the same reference numerals. The ECL circuit shown in FIG. 7 uses transistors T6 and T7 substituted for the diodes D1 and D2. The collectors of the transistors T6 and T7 are supplied with a high-potential side power voltage $V_{CC2}$ which is equal to or higher than the ground potential. The bases of the transistors T6 and T7 are connected to the variable control terminal C to which the control voltage $V_G$ is applied. The control voltage $V_G$ is generated by, for example, the variable control voltage source Ec as shown in FIG. 5. The emitter of the transistor T6 is connected to the resistor $R_{L2}$, and the emitter of the transistor T7 is connected to the resistor $R_{L21}$.

It is now assumed that the level of the input signal $V_{IN}$ becomes higher than that of the input signal $V_{\overline{IN}}$. In this case, the transistor T1 is turned ON, and the transistor T2 is turned OFF. A current passes from the ground potential GND to the first low-potential side voltage $V_{EE1}$ through the pull-up resistor (load resistor) $R_{L1}$, the transistor T1 and the constant current source transistor T3. During this operation, the second high-potential side voltage $V_{CC2}$ is being applied to the collectors of the transistors T6 and T7. When the control voltage $V_G$ is applied to the bases of the transistors T6 and T7, the transistors T6 and T7 are turned ON and OFF. Since the transistor T1 is ON, a current passes from the second high-potential side voltage $V_{CC2}$ to the first low-potential side voltage $V_{EE1}$ through the transistor T6, the resistor $R_{L2}$, the transistor T1 and the constant-current source transistor T3. This is equivalent to an arrangement in which the resistor $R_{L2}$ is connected to the pull-up resistor (load resistor $R_{L1}$ in parallel form. Thus, by setting the control voltage $V_G$ so that the aforementioned condition is satisfied, the load resistance of the transistor T1 is reduced, and the output voltages $V_X$ and $V_{\overline{X}}$ have reduced amplitudes. As a result, the propagation delay time $t_{pd}$ is reduced. Further, by controlling the control voltage $V_G$ applied to the transistor T6, it becomes possible to continuously vary the propagation delay time $t_{pd}$.

Figure 8:
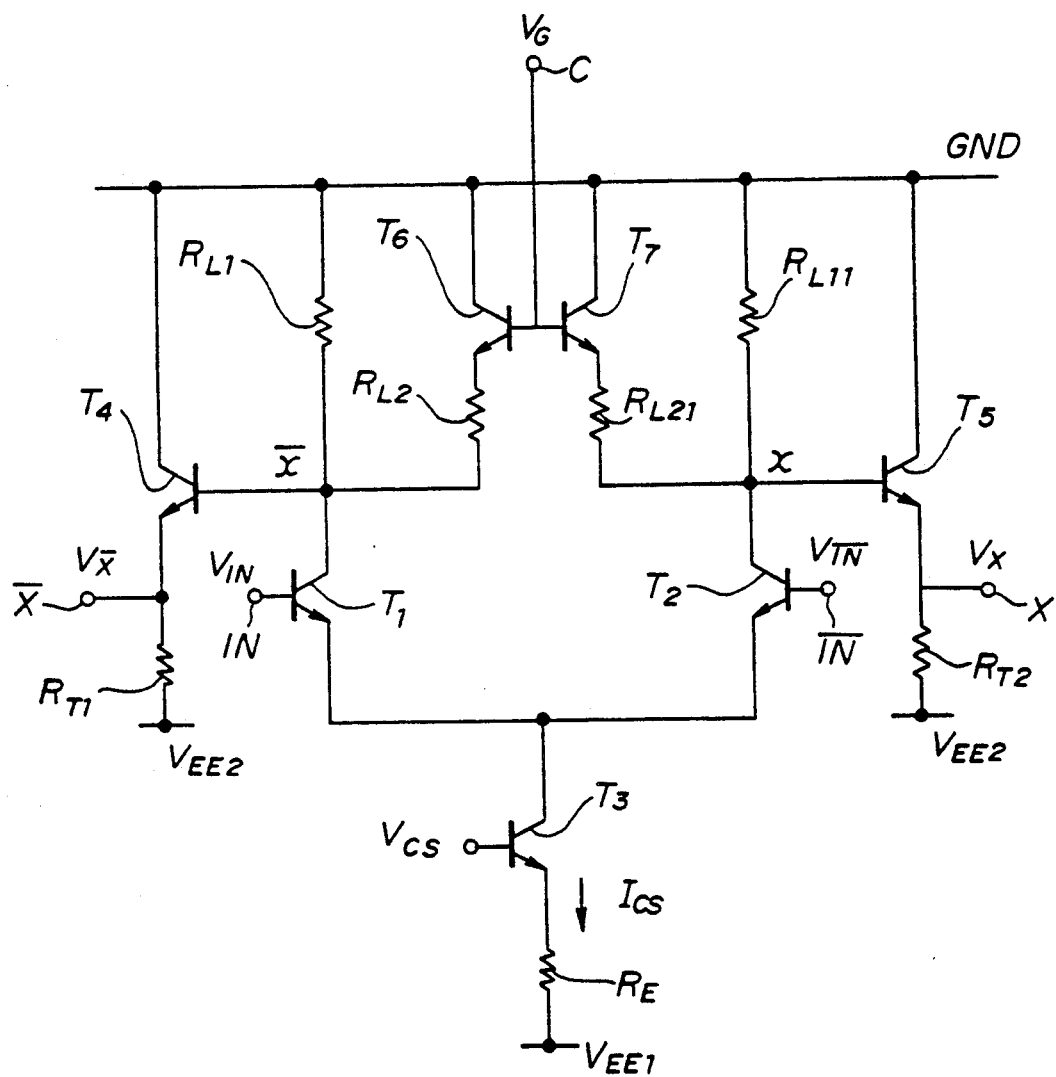
FIG. 8 is a circuit diagram of an ECL circuit according to a third preferred embodiment of the present invention.

A description will now be given of an ECL circuit according to a third preferred embodiment of the present invention with reference to FIG. 8, in which those parts which are the same as those shown in the previous figures are given the same reference numerals. The ECL circuit shown in FIG. 8 has two transistors T6 and T7 as in the structure shown in FIG. 7. However, the ECL circuit shown in FIG. 8 is different from that shown in FIG. 7 in that the collectors of the transistors T6 and T7 shown in FIG. 8 are connected to the ground-potential power supply line.

It is now assumed that the level of the input signal $V_{IN}$ becomes higher than that of the input signal $V_{\overline{IN}}$. In this case, the transistors T1 and T2 are turned ON and OFF, respectively. When the control voltage $V_G$ is applied to the bases of the transistors T6 and T7 via the control terminal C, the resistor $R_{L2}$ is connected to the resistor $R_{L1}$ in parallel form, so that the load resistance of the transistor T1 is reduced, and the amplitude of the output voltage $V_X$ is also reduced. As a result, the propagation delay time $t_{pd}$ is shortened. Further, by changing the control voltage $V_G$, it becomes possible to continuously change the propagation delay time $p_{td}$.

Figure 9:
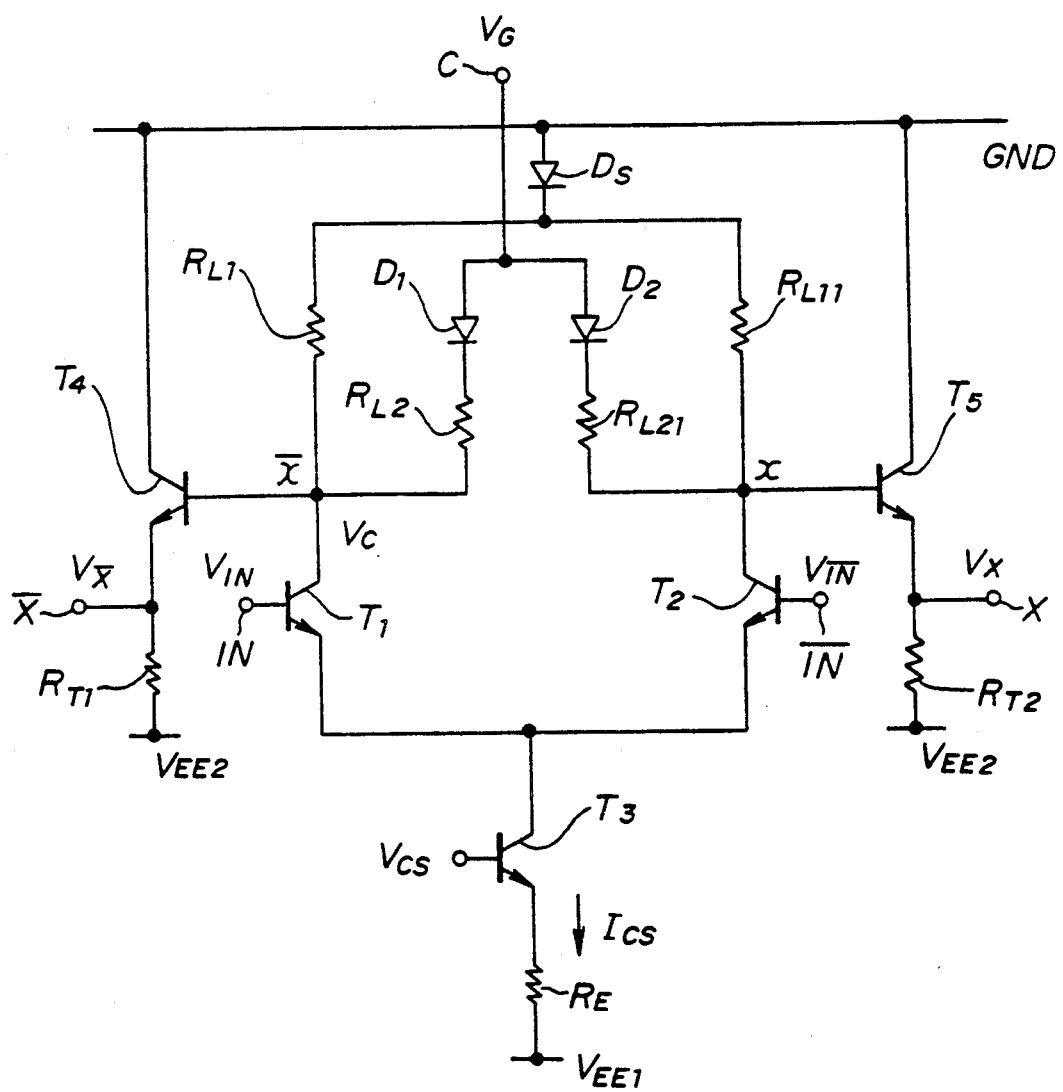
FIG. 9 is a circuit diagram of an ECL circuit according to a fourth preferred embodiment of the present invention.

A description will now be given of an ECL circuit, according to a fourth preferred embodiment of the present invention with reference to FIG. 9. The ECL circuit shown in FIG. 9 is different from the ECL circuit shown in FIG. 5 in that a level shift diode Ds is provided between the ground-potential power supply line and the pull-up resistors $R_{L1}$ and $R_{L11}$. The level shift diode Ds is directed to reducing the amplitudes of the signals of the ECL circuit and making the ECL circuit operate at a higher speed. The level shift diode Ds can be formed by a transistor which is manufactured during a process in which other transistors, such as T1 and T2, are manufactured.

The level shift diode Ds develops a fixed voltage drop. Thus, the voltage drops developed across the pull-up resistors $R_{L1}$ and $R_{L11}$ are limited, so that the switching operation speed increases. The amplitude of the output voltages $V_X$ corresponds to the sum total of the voltage drop developed across the pull-up resistor $R_{L1}$ and the voltage drop developed across the level shift diode Ds. Thus, the ECL circuit shown in FIG. 9 provides the output voltage $V_X$ which is the same as the output voltage $V_X$ provided by the ECL circuit shown in FIG. 5. It can be said that the controllable range of the control volt $V_G$ is shifted toward the low-potential side by a potential which corresponds to the forward voltage of the level shift diode Ds.

Figure 10:
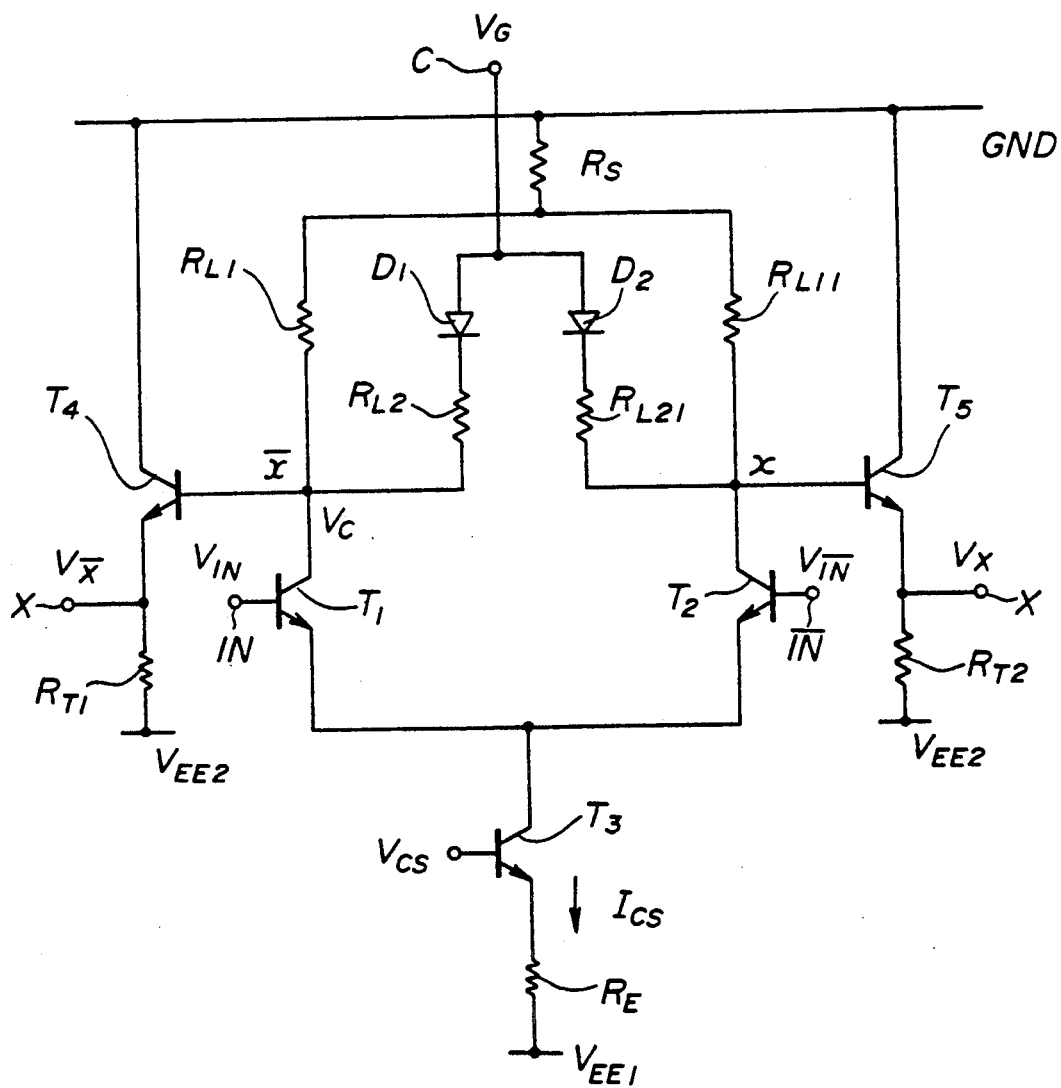
FIG. 10 is a circuit diagram of an ECL circuit according to a fifth preferred embodiment of the present invention.

A description will now be given of an ECL circuit according to a fifth embodiment of the present invention with reference to FIG. 10, in which those parts which are the same as those shown in the previous figures are given the same reference numerals. The ECL circuit shown in FIG. 10 is different from the ECL circuit shown in FIG. 9 in that a level shift resistor Rs is substituted for the level shift transistor Ds. That is, the level shift resistor Rs is connected between the ground-potential power supply line and the pull-up resistors $R_{L1}$ and $R_{L11}$. The level shift resistor Rs may be fabricated in the same production process as other resistors $R_{T1}$ and $R_{T2}$. Of course, it is possible to fabricate the level shift resistor Rs in a production process different from that for producing the other resistors.

Figure 11A:
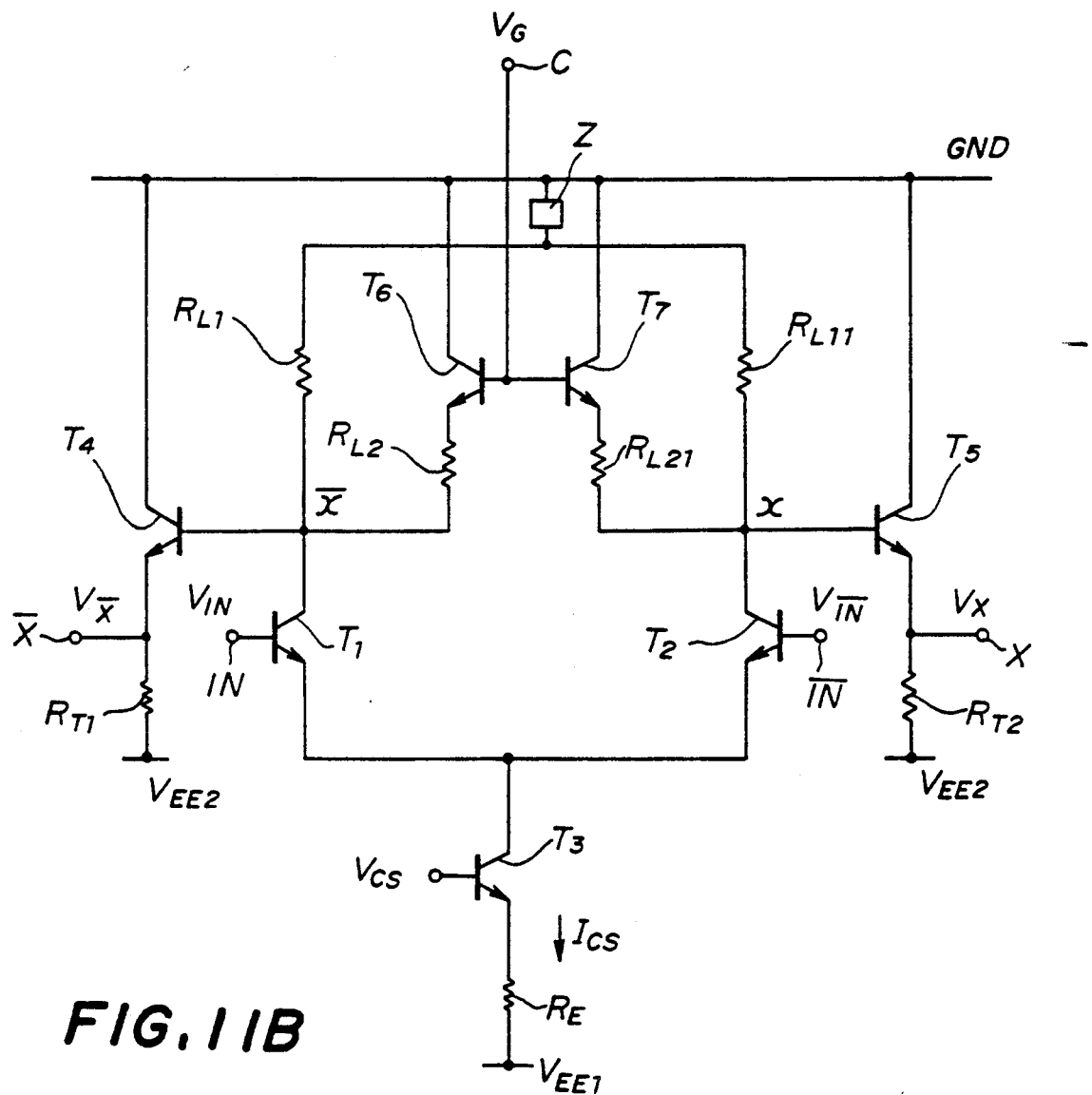
FIG. 11A is a circuit diagram of an ECL circuit according to a sixth preferred embodiment of the present invention.
Figure 11B:
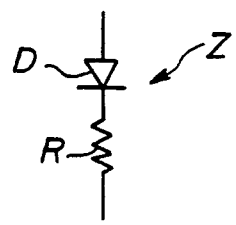
FIG. 11B is a circuit diagram illustrating a claim circuit formed of a series circuit consisting of a clamp diode and a clamp resistor.

A description will now be given of an ECL circuit according to a sixth preferred embodiment of the present invention with reference to FIG. 11A, in which those parts which are the same as those shown in the previous figures are given the same reference numerals. The ECL circuit shown in FIG. 11A is different from the ECL circuit shown in FIG. 8 in that a level shift element Z is provided between the ground-potential power supply line and the pull-up resistors $R_{L1}$ and $R_{L11}$. The level shift element Z can be formed of the level shift diode Ds shown in FIG. 9, the level shift resistor Rs shown in FIG. 10, or a series circuit shown in FIG. 11B. The series circuit shown in FIG. 11 is composed of the level shift diode Ds and the level shift resistor Rs.

Figure 12:
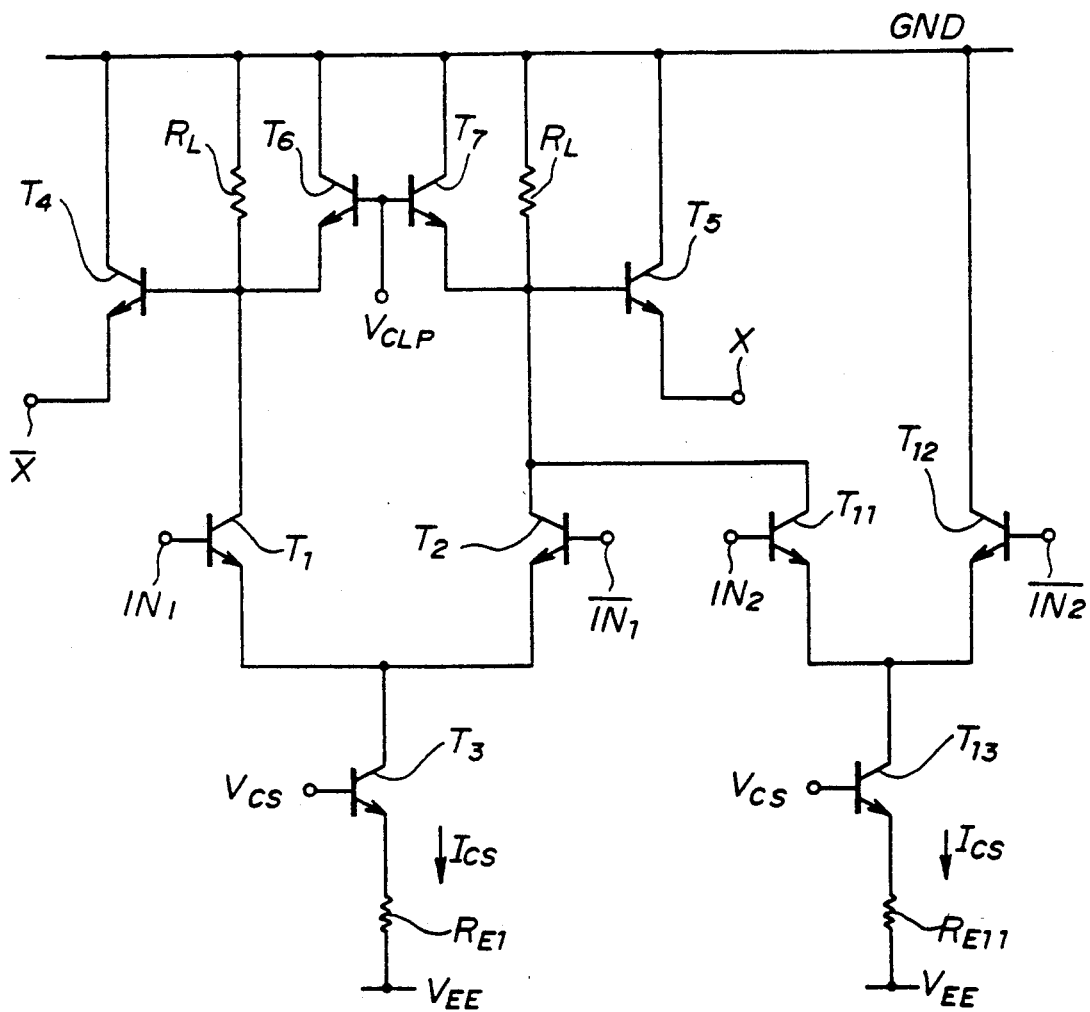
FIG. 12 is a circuit diagram of a conventional ECL circuit with a clamp circuit.

Finally, a description will be given of the difference between the ECL circuit according to the present invention and a conventional clamp circuit. With reference to FIG. 12, there is illustrated a conventional ECL circuit with a clamp circuit. The ECL circuit shown in FIG. 12 is a collector dotting type logic circuit. Transistors T6 and T7 form a clamp circuit. Further, transistors T11, T12 and T13 are provided. The transistors T11 and T12 receive input signals IN2 and IN2, respectively. When the transistors T2 and T11 are ON, and the transistors T1 and T12 are OFF, a current $2I_{cs}$ twice the constant current $I_{cs}$ passing through the transistor T3 or T13 passes through one of the load resistors $R_L$. Thereby, it becomes possible to prevent the low (L) levels of the input and output signals from decreasing. A circuit arrangement obtained by omitting the transistors T11, T12 and T13 is different from the circuit arrangement shown in FIG. 8 in that the resistors $R_{L2}$ and $R_{L21}$ shown in FIG. 8 are not connected to the emitters of the transistors T6 and T7. It should be noted that the resistors $R_{L2}$ and $R_{L21}$ connected to the emitters of the transistors T6 and T7 play the important role to control the propagation delay time. This will be explained with reference to FIG. 13 and FIG. 14.

Figure 13:
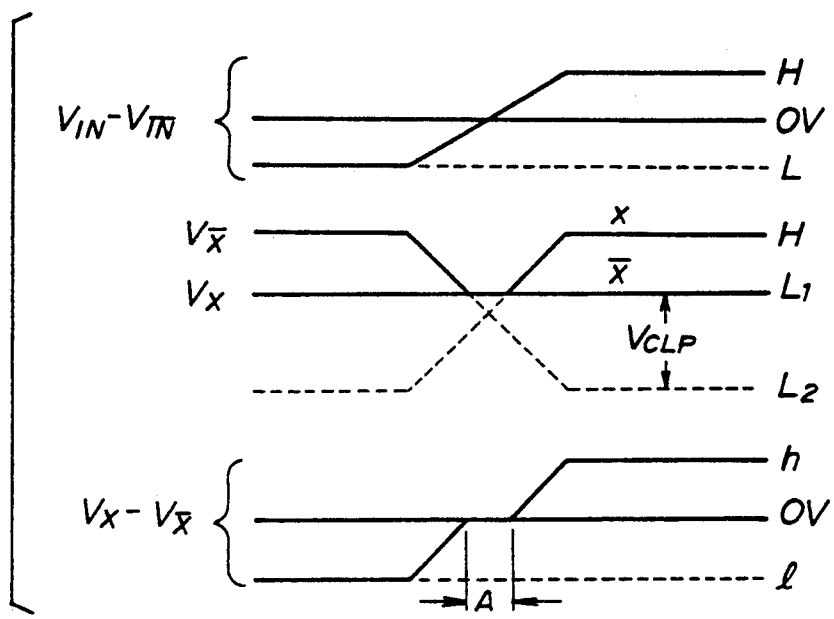
FIG. 13 is a waveform diagram illustrating the operation of the ECL circuit shown in FIG. 12.
Figure 14:
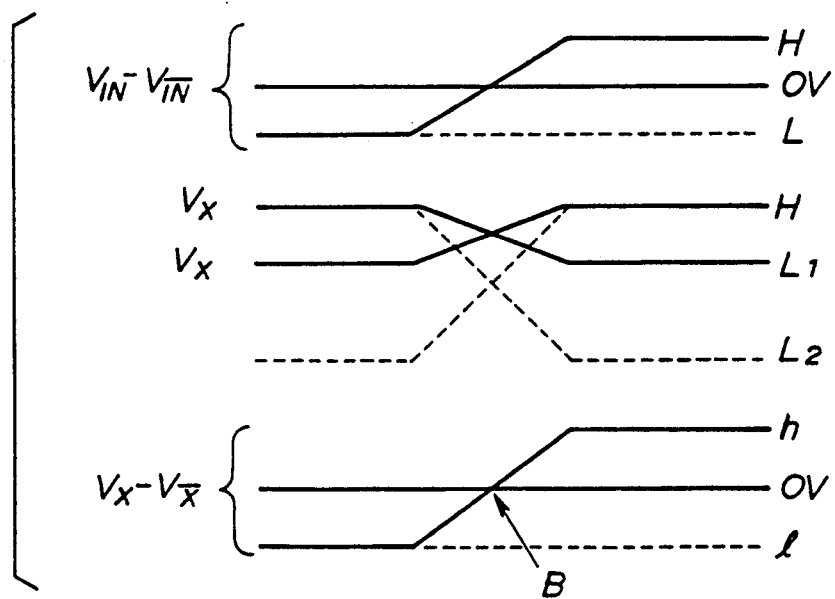
FIG. 14 is a circuit diagram illustrating the operation of the ECL circuit according to the present invention.

When the difference between the input signals $V_{IN}$ and $V_{\overline{IN}}$ changes as shown in FIG. 13, the output voltages $V_X$ and $V_{\overline{X}}$ changes as shown in FIG. 13. The output voltages $V_X$ and $V_{\overline{X}}$ are based on the difference between the input voltages and $V_{\overline{IN}}$. The output voltages $V_X$ and $V_{\overline{X}}$ are clamped by the transistors T6 and T7, respectively. The bases of the transistors T6 and T7 are supplied with a clamp voltage $V_{CLP}$ which determines a voltage at which the output voltages $V_X$ and $V_{\overline{X}}$ are clamped. When the clamp voltage $V_{CLP}$ is equal to a certain voltage, the output voltages $V_X$ and $V_{\overline{X}}$ are equal to each other. In this case, the difference between $V_X$ and $V_{\overline{X}}$ is continuously equal to zero. In FIG. 13, the difference between $V_X$ and $V_{\overline{X}}$ is zero during a period A. It should be noted that the state where there is no difference between $V_X$ and $V_{\overline{X}}$ is an indefinite logic level other than the logically low (L) and high (H) levels. The existence of the indefinite logic level increases a jitter (time-width variation), particularly when a high-speed input signal is applied to the ECL circuit, and thus prevents smooth control of the propagation delay time $t_{pd}$. On the other hand, as shown in FIG. 14, no continuous indefinite logic level occurs because of the existence of the resistors $R_{L2}$ and $R_{L21}$. As a result, it becomes possible to smoothly control the propagation delay time $t_{pd}$ without having jitters.

The present invention is not limited to the specifically disclosed embodiments, and variations and modifications may be made without departing from the scope of the present invention.

What is claimed is:

1. A controllable delay logic circuit comprising:
   a differential circuit having first and second transistors respectively having a collector, an emitter and a base, the emitters of said first and second transistors being connected to each other, the bases of said first and second transistors being respectively supplied with first and second input signals, and first and output signals being drawn from the collectors of the first and second transistors, respectively;
   a first load coupled between a first power supply line and the collector of said first transistor;
   a second load coupled between said first power supply line and the collector of said second transistor;
   a constant-current source connected between a second power supply line and the emitters of said first and second transistors;
   a control terminal to which a control voltage is applied;
   a variable power source means, coupled to said control terminal, for generating a continuously variable voltage which corresponds to said control voltage and which defines a continuously variable propagation delay time between said first input signal and said first output signal and so continuously variable propagation delay time between said second input signal and said second output signal;
   first current path means, having a first resistor having a first end connected to the collector of the first transistor and a second end coupled to the control terminal via a first switching element, for controlling a conducting state of said first switching element on the basis of the control voltage so that a composite resistor composed of the first load and the first resistor has a resistance which continuously varies between a resistance of the first load and a composite resistance of the first load and the first resistor on the basis of the control voltage; and second current path means, having a second resistor having a third end connected to the collector of the second transistor and a fourth end coupled to the control terminal via a second switching element, for controlling a conducting state of said second switching element on the basis of the control voltage so that a composite resistor composed of the second load and the second resistor has a resistance which continuously varies between a resistance of the second load and a composite resistance of the second load and the second resistor on the basis of the control voltage.

2. A controllable delay logic circuit as claimed in claim 1, wherein:

said first switching element comprises a first diode connected to said first resistor in series; and said second switching element comprises a second diode connected to said second resistor in series.

3. A controllable delay logic circuit as claimed in claim 2, wherein:

said first diode has an anode connected to said control terminal, and a cathode coupled to the collector of said first transistor via said first resistor; and said second diode has an anode connected to said control terminal, and a cathode coupled to the collector of said second transistor via said second resistor.

4. A controllable delay logic circuit as claimed in claim 1, wherein:

said first current path means comprises in third transistor having a collector connected to a power source, a base connected to said control terminal, and an emitter connected to the second end of said first resistor; and said second current path means comprises a fourth transistor having a collector connected to said power source, a base connected to said said control terminal and an emitter connected to the second end of said second resistor.

5. A controllable delay logic circuit as claimed in claim 2, wherein:

said first current path means comprises a third transistor having collector connected to said first power supply line, an emitter connected to the second end of said first resistor, and a base connected to said control terminal; and said second means comprises a fourth transistor having a collector connected to said first power supply line, an emitter connected to the second end of said second resistor, and a base connected to said said control terminal.

6. A controllable delay logic circuit as claimed in claim 1, further comprising level shift means, provided in common for said first and second loads, for providing said first and second loads with a fixed voltage drop so that the first and second loads are supplied with a level-shifted voltage which is less than a potential of said first power supply line by said fixed voltage drop.

7. A controllable delay logic circuit as claimed in claim 6, wherein said level shift means comprises a resistor connected between said first power supply line and said first and second loads.

8. A controllable delay logic circuit as claimed in claim 6, wherein said level shift means comprises a diode connected between said first power supply line and said first and second loads.

9. A controllable delay logic circuit as claimed in claim 6, wherein said level shift means comprises a series circuit which is composed of a diode and a resistor and which is connected between said first power supply line and said first and second loads.

10. A controllable delay logic circuit as claimed in claim 1, wherein said first power supply line has a potential higher than that of said second power supply line.

11. A controllable delay logic circuit as claimed in claim 10, wherein said first power source generates a potential higher than that of said first power supply line.

12. A controllable delay logic circuit as claimed in claim 1, further comprising:

third transistor having a base connected to the collector of said first transistor, a collector connected to said first power supply line, and an emitter through which said first output voltage is output; and fourth transistor having a base connected to the collector of said second transistor, a collector connected to said first power supply line, and an emitter through which said second output voltage is output.

13. A controllable delay logic circuit as claimed in claim 1, wherein:

said first load comprises a first load resistor; and said second load comprises a second load resistor.

14. A controllable delay logic circuit comprising:

a differential circuit having first and second transistors respectively having a collector, an emitter and a base, the emitters of said first and second transistors being connected to each other, the bases of said first and second transistors being respectively supplied with first and second input signals, and first and output signals being drawn from the collectors of the first and second transistors, respectively:

a first load coupled between a first power supply line and the collector of said first transistor;

a second load coupled between said first power supply line and the collector of said second transistor;

a constant-current source connected between a second power supply line and the emitters of said first and second transistors;

a control terminal to which a control voltage is applied;

first time constant control means, having a first resistor having a first end connected to the controller of the first transistor and a second end coupled to said control terminal via a first switching element, for continuously varying a first time constant defined by said first resistor and a parasitic capacitance coupled to the collector of said first transistor so that a composite resistor composed of the first load and the first resistor has a resistance which continuously varies between a resistance of the first load and a composite resistance of the first load and the first resistor on the basis of the control voltage; and second time constant control means, having a second resistor having a third end connected to the collector of the second transistor and a fourth end coupled to said control terminal via a second switching element, for continuously varying a second time constant defined by said second resistor and a parasitic capacitance coupled to the collector of said second transistor controlling a conducting state of said second switching element on the basis of the control voltage so that a composite resistor composed of the second load and the second resistor has a resistance which continuously varies between a resistance of the second load and a composite resistance of the second load and the second transistor on the basis of the control voltage.

15. A controllable delay logic circuit comprising:

a differential circuit having first and second transistors respectively having a collector, an emitter and a base, the emitters of said first and second transistors being connected to each other, the bases of said first and second transistors being respectively supplied with first and second input signals, and first and output signals being drawn from the collectors of the first and second transistors, respectively;

a first load coupled between a first power supply line and the collector of said first transistor;

a second load coupled between said first power supply line and the collector of said second transistor;

a constant-current source connected between a second power supply line and the emitter of said first and second transistors;

a control terminal to which a control voltage is applied;

first load resistance control means, coupled to said first load, for continuously varying, within a resistance range dependent on said control voltage, a first load resistance provided by said first load by providing a first resistor having a first end connected to the collector of said first transistor and a second end coupled to said control terminal; and second load resistance control means, coupled to said second load, for continuously varying, within the resistance range dependent by said control voltage, a second load resistance provided by said second load by providing a second resistor having a third end connected to the collector of said second transistor and a fourth end coupled to said control terminal.

* * * * *

UNITED STATES PATENT AND TRADEMARK OFFICE
CERTIFICATE OF CORRECTION

PATENT NO.   : 5,270,586
DATED        : Dec. 14, 1993
INVENTOR(S)  : Emori et al It is certified that error appears in the above-indentified patent and that said Letters Patent is hereby corrected as shown below:

On the cover page, please insert item [30] as follows:

[30]  Foreign Application Priority Data

Nov. 2, 1989 [JP]  Japan.......................1-286567

Signed and Sealed this

Twenty-fourth Day of May, 1994

Attest:

BRUCE LEHMAN

Attesting Officer　　　Commissioner of Patents and Trademarks